(12) United States Patent
Avery et al.

(10) Patent No.: US 7,303,782 B2
(45) Date of Patent: Dec. 4, 2007

(54) EXTRUSION DIE COATING METHOD

(75) Inventors: James F. Avery, Horseheads, NY (US);
Thomas W. Brew, Corning, NY (US);
Samir Khanna, Painted Post, NY (US);
Mark A. Shalkey, Corning, NY (US);
Yawei Sun, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 460 days.

(21) Appl. No.: 11/000,690

(22) Filed: Nov. 30, 2004

(65) Prior Publication Data

US 2006/0115592 A1    Jun. 1, 2006

(51) Int. Cl.
*C23C 16/00* (2006.01)
*B05D 1/32* (2006.01)
*B05D 5/00* (2006.01)

(52) U.S. Cl. .................................. 427/248.1; 427/282
(58) Field of Classification Search ...................... None
See application file for complete search history.

(56) References Cited

U.S. PATENT DOCUMENTS 5,952,079 A    9/1999   Andou et al.
6,193,497 B1*  2/2001   Suzuki ........................ 425/380
7,132,124 B2* 11/2006   Matsumoto et al. ........ 427/135

FOREIGN PATENT DOCUMENTS

EP    0 674 018    6/1999

* cited by examiner

*Primary Examiner*—Timothy Meeks
*Assistant Examiner*—Kelly M Stouffer
(74) *Attorney, Agent, or Firm*—Joseph M. Homa; Kees van der Sterre

(57) ABSTRACT

Apparatus and a method for selectively vapor-coating an extrusion die to extrude honeycombs with desired distributions of web thicknesses, wherein at least one perforated impedance or preferential coating plate with a desired pattern of holes is positioned adjacent to, but spaced apart from, a face of the extrusion die to be coated, whereby a coating gas passed through the coating plate and into the die imparts a desired coating distribution to the extrusion die slots that is effective to closely control the web thickness distribution in honeycombs extruded therefrom.

15 Claims, 5 Drawing Sheets

US 7,303,782 B2

EXTRUSION DIE COATING METHOD

BACKGROUND OF THE INVENTION

Extrusion dies are useful in forming cellular or honeycomb ceramic substrates for use in catalytic converters, which are utilized in exhaust systems of internal combustion engines. In order to reduce back pressure within the exhaust system, it is necessary that the cell walls or webs have a substantially thin cross-sectional dimension so as to provide a substantially large open frontal area. However, the thin walled structure must be protected so as to withstand normal automotive impact requirements. One way to protect the inner cells is to increase the thickness of the cell walls in peripheral portions of the extruded ceramic substrate, thus providing additional strength to withstand external loads.

European Patent Specification EP 0 674 018 B1 teaches the use of blocking plates during the recoating of dies to obtain uniform slot width. The blocking plates are used to limit the amount of coating applied to worn dies that need to be recoated and be within constant web thickness. U.S. Pat. No. 5,952,079 uses a mask in the form of a Teflon tape to block off outer portions of a die during liquid nickel plating, so as to inhibit the occurrence of edge chipping of a honeycomb structure. Problems can arise in connection with the latter method, however, in that it is difficult to control plating gradients and to achieve uniform results under varying conditions of liquid flow and tape alignment.

The present invention overcomes problems encountered in the prior art by setting forth a controlled approach for obtaining desired web thicknesses of a honeycomb structure, by controlling the flow of gases within slots of a honeycomb extrusion die during the chemical vapor deposition (CVD) coating of the die.

SUMMARY OF THE INVENTION

The present invention relates to the manufacture of extruded honeycomb structures and more particularly to improved methods and apparatus for manufacturing honeycomb structures of modified web geometries exhibiting improved strength and enhanced flow properties. The invention provides a desired distribution of web thickness in an extruded honeycomb substrate.

The desired web distribution is obtained by providing desired distributions of slot widths in honeycomb extrusion dies during chemical vapor deposition (CVD) coating of the dies. Such desired coating distributions may be variable to provide variable slot widths across the die face, or constant to provide a constant slot width. Also if desired, a portion of the coating may be variable and an adjacent portion may be constant. When the flow of CVD gas is reduced in the peripheral extrusion area of the die, less coating thickness will result in such region as compared to other regions where gas flows are not reduced. As a result, the extruded webs in such peripheral region of the honeycomb substrate will be thicker and stronger than the other region.

The present invention thus provides a way to better control the distribution of the thickness of extruded honeycomb webs by controlling the CVD coating thickness distribution in a honeycomb extrusion die. In a specific embodiment, the invention provides means for controlling the distribution of a CVD coating to a die in such a manner so as to provide thicker webs in a peripheral region of a honeycomb substrate resulting in additional strength to withstand external loads. Coating hardware to produce a gradual increase in the web thickness over a desired region of a honeycomb substrate is also provided.

DETAILED DESCRIPTION OF THE INVENTION

Figure 1:
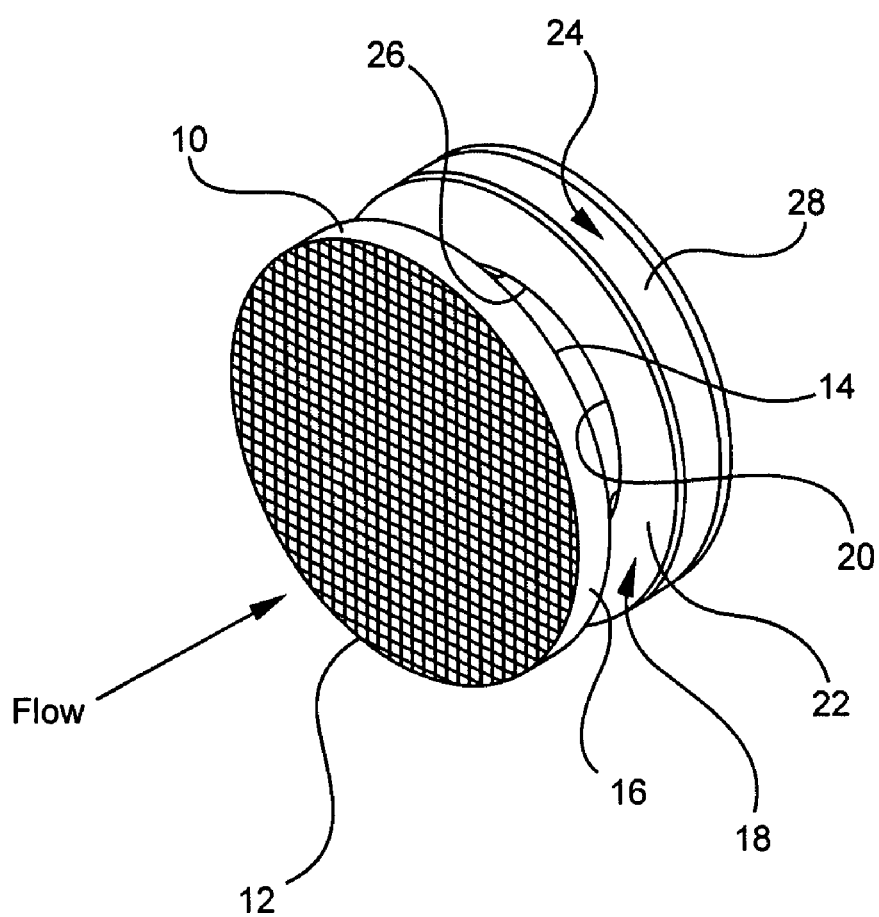
FIG. 1 illustrates one embodiment of the invention.

FIG. 1 illustrates an arrangement for coating a die with a reduced amount of coating in a peripheral region of the slots. An extrusion die 10 for forming honeycomb structures is shown having an upstream slot portion 12 and a downstream hole portion 14, bounded by a solid outer rim portion 16. A spacer ring or shim 18 is positioned on the downstream or hole side 14 of the die 10. The shim 18 has an inner dimension substantially equal to the outer dimension of the hole portion 14, forming an open inner portion 20 bounded by a ring portion 22. A disk member 24, also having an open inner portion 26 bounded by an outer ring portion 28, is positioned on the spacer ring 18. The ring portion 28 of the disk 24 extends over that portion of the die 10 where it is desired to limit the thickness of the coating. If desired, the disk member 24 may have an angled surface facing the die 10 which will affect thickness variation of an applied coating. The thickness of the spacer 18 also controls in part the amount of coating obtained on the peripheral region of the die.

The flow of gas in FIG. 1 is into the upstream slot side 12 of the die 10. With the disk member 24 overlying a peripheral portion of the die holes 14, a reduced amount of coating material flows into the peripheral region of the slots, resulting in such slots having a greater width than those that were not covered. Thus when material is extruded through the die 10, the outer webs or cell walls will be thicker and thereby stronger to withstand external loads.

Figure 2:
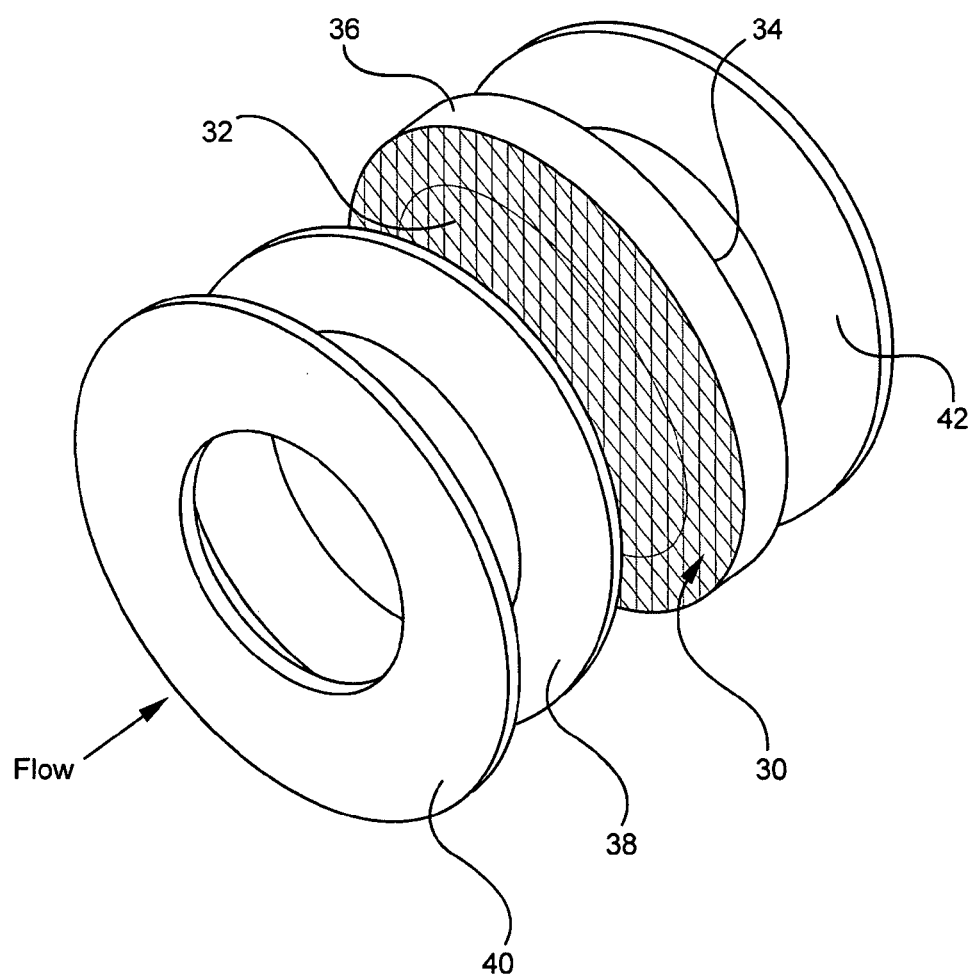
FIG. 2 illustrates an other embodiment of the invention.

FIG. 2 illustrates a different set-up to obtain the same results as that obtained with the arrangement shown in FIG. 1, that is to obtain less CVD coating in the peripheral area of a honeycomb extrusion die. An extrusion die 30 for forming honeycomb structures is shown with an upstream slot side portion 32 and a downstream hole side portion 34 bounded by a rim portion 36. A shim or spacer ring 38 having an inner dimension equal to the outer dimension of the hole portion 34 is positioned on the slot side 32 of the die, and a disk member 40 is positioned on the shim 38. The disk member 40 has an inner dimension selected to overlie that peripheral portion of the extrusion die 30 where a reduced amount of coating is desired.

An optional additional disk member 42, similar to member 40, may be positioned on the downstream hole side 34 of the die 40, with or without the use of a shim. The use of such a downstream disk member will change the coating thickness distribution in the peripheral region beyond that which would be obtained if no downstream disk were used.

Like the results obtained with the device of FIG. 1, the hardware of FIG. 2 produces a reduced gas flow about the peripheral region of the die and thus results in wider slots in such region.

Figure 3:
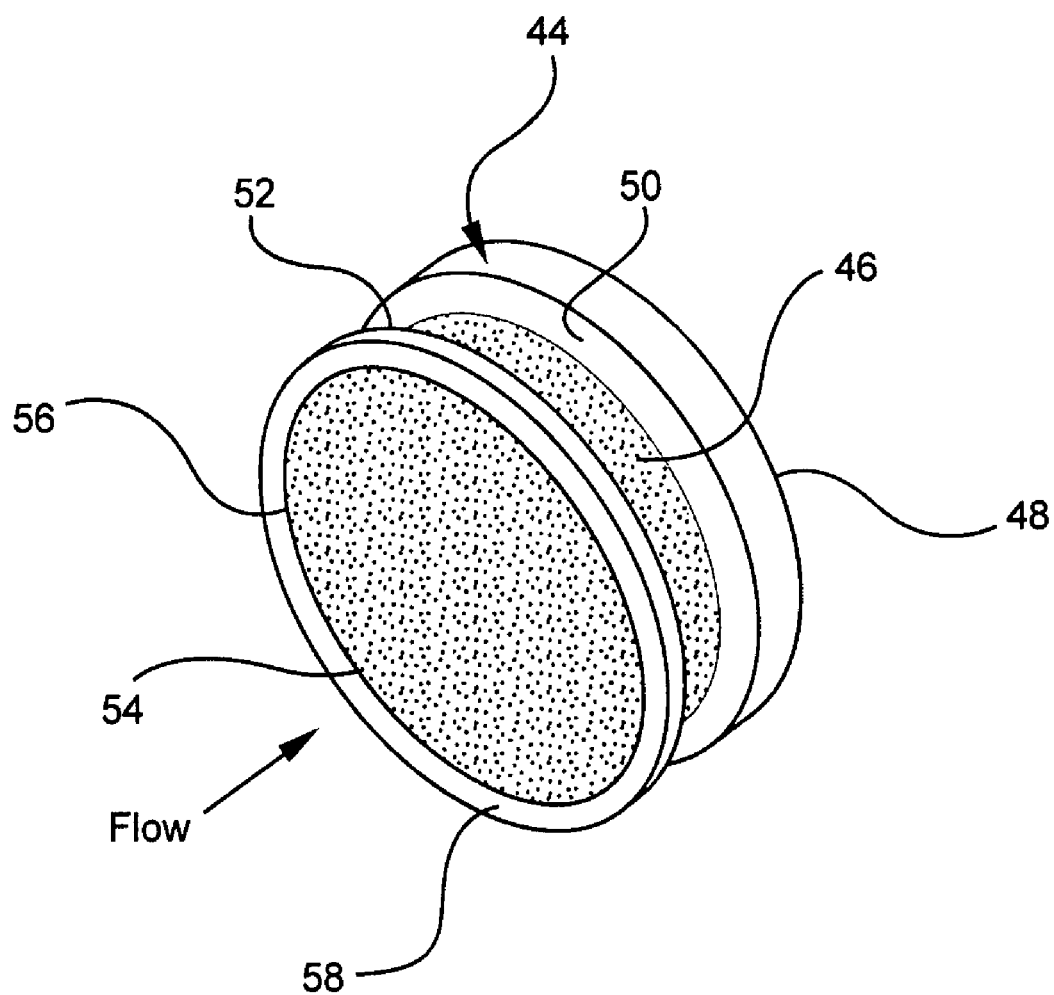
FIG. 3 Illustrates a further embodiment of the invention.

FIG. 3 shows another approach of producing a die with a desired flow distribution of CVD coating material in selected slots. The hardware illustrated in FIG. 3 will provide a reduction in coating thickness about the peripheral region of the die, similar to that produced by the embodiments shown in FIGS. 1 and 2. Die 44 is shown having its hole side 46 upstream and slot side 48 downstream bounded by a solid rim 50. An impedance plate 52 is shown having a drilled or perforated central portion 54 of constant thickness, a drilled or perforated variable thickness area 56 surrounding the central portion 54, and a solid rim portion 58 corresponding to rim portion 50 of die 44. The through-holes in the impedance plate 52 are of uniform diameter and preferably aligned with the holes in side 46 of die 44. If desired, a spacer plate, not shown, may be positioned between the die 44 and the impedance plate 52.

With this particular arrangement, the flow of coating material produces a variable reduced coating in the slots about the periphery of the die and a constant slot wall coating thickness centrally of the die. However, it should be understood that almost any desired coating distribution in the slots across the die could be obtained by different thickness profiles being produced on the impedance plate 52. That is, the thicker the impedance plate, the thinner the corresponding die slot coating. Further, non-uniform diameter holes could be formed in plate 52, if desired.

Figure 4:
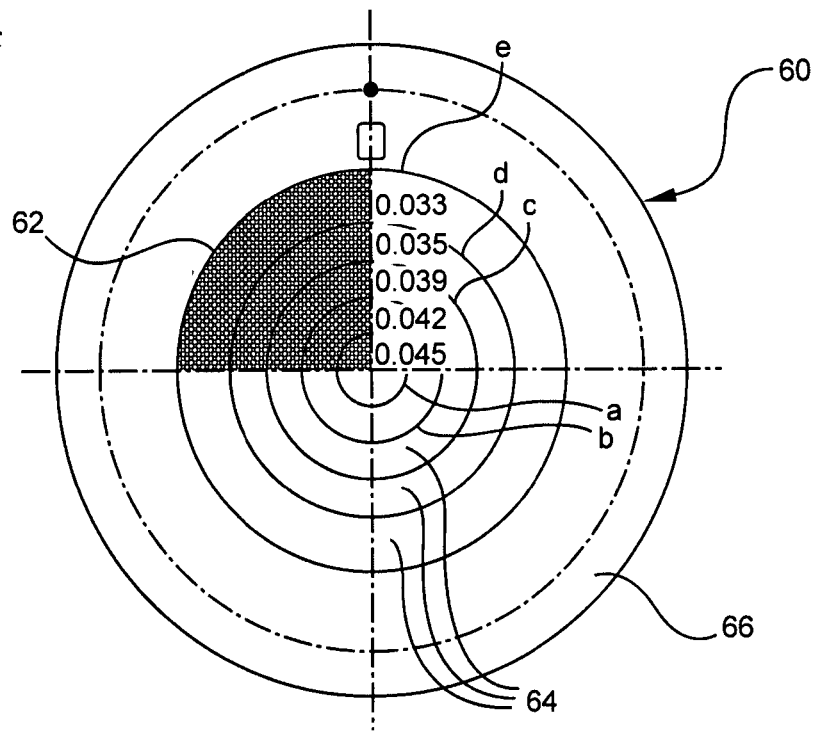
FIG. 4 is a plan view of an impedance plate or preferential coating plate of the present invention.
Figure 5:
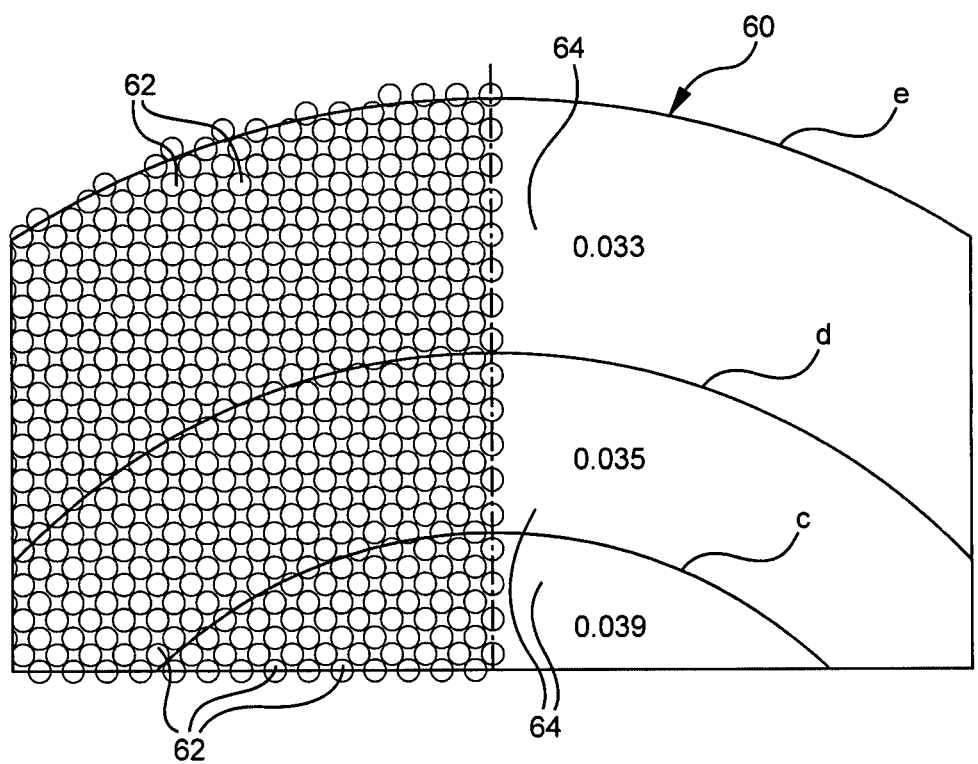
FIG. 5 is an enlarged portion of the plate of FIG. 4.
Figure 7:
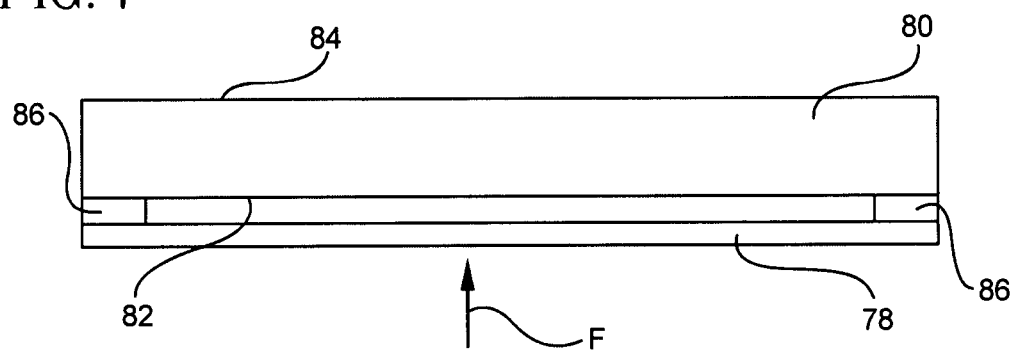
FIG. 7 illustrates a preferred embodiment of the invention.

FIGS. 4 and 5 show a preferred form of an impedance plate or preferential coating plate 60 for use with a round extrusion die, such as die 80 of FIG. 7. The preferential coating plate 60 is of uniform thickness, but is provided with plurality of through-holes 62 in concentric patterns or rings 64, bounded by an outer rim 66. Although various patterns 64 of holes 62 may be utilized to obtain different desired distributions of slot wall thickness, the plate 60 is designed to gradually reduce the coating distribution in the slots of a round die, in radially outwardly concentric patterns from the center of the die.

As a specific illustration, plate 60 is shown having concentric patterns a, b, c, d, and e, each being radially outwardly from the center of the plate and radially disposed from each other. As noted in the illustration, the diameter of the holes 62 in each pattern decreased from 0.046" in the central hole pattern a to 0.033" in outer hole pattern e. See also FIG. 5 for a blowup of the outer three patterns c, d and e, where all of the holes 62 in pattern c have a diameter of 0.039, all those in pattern d have a diameter of 0.035", and all those in pattern e have a diameter of 0.033". It thus can be seen, that in each particular pattern, the diameter of all the holes in that pattern is the same. When positioned on a die, the outer extent of pattern e would complement the outer extent of the feed holes or the periphery of the slot face of the die. Since the hole diameters in each pattern decreases for the central pattern a to the outer most pattern e, as CVD coating gas is passed through preferential coating plate 60 into an extrusion die upon which it is positioned, the distribution of coating on the slot walls will be gradually reduced from a central portion of the die toward the periphery. That is, the larger the diameter of the holes in the impedance plate, the thicker the corresponding die slot coating, and the smaller the hole diameters, the thinner the coating on the slot walls of the die. However, the distribution of the pattern of holes in a impedance plate does not have to be a gradual decrease or increase in diameter from a center or a periphery of a given die, but such distribution in the plate may be such so as to produce any variation of a desired coating thickness across the face of the die.

Figure 6:
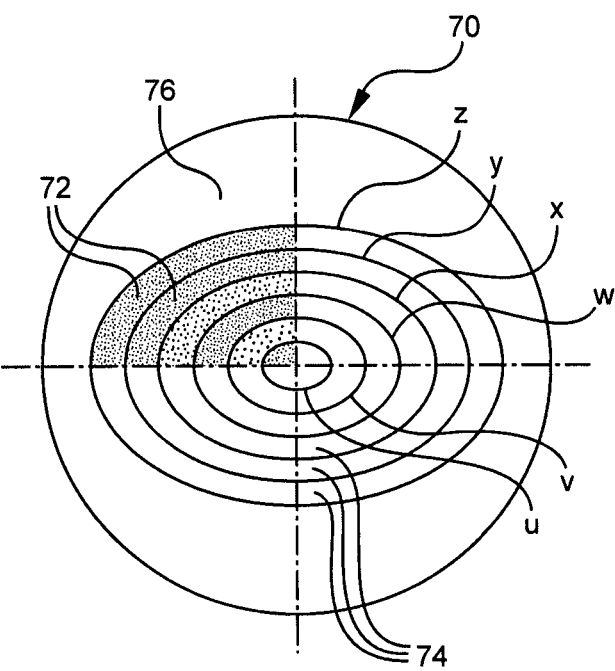
FIG. 6 is a further embodiment of an impedance or preferential coating plate of the present invention.

FIG. 6 shows a further preferred embodiment of an impedance plate or preferred coating plate for use with an oval extrusion die. Like plate 60, the preferential coating plate 70 is of uniform thickness with an outer rim 76. However, plate 70 is provided with an oval-like pattern 74 of flow-through holes 72 which may extend from a central portion of an oval extrusion die to the periphery of the die slot face. The preferential coating plate 70 is provided with an array of oval-like patterns, u, v, w, x, y, and z, extending from center pattern u to outer pattern z, having an outer periphery corresponding to the outer periphery of the die slot face upon which the plate is to be positioned. The pattern y is of a normal oval configuration, and the remaining patterns are actually percentages of the normal, but are substantially concentric with each other.

If it were desired to extrude a honeycomb substrate with gradually increasing web thicknesses from a center portion toward a peripheral portion, holes 62 in the various patterns u through z of plate 70 would have gradually decreasing diameters. Again, however, size of the holes selected for the various patterns and even the particular pattern arrangement chosen, may be varied to produce the desired distribution of slot widths in a honeycomb extrusion die. Accordingly, if some special or unique extruded honeycomb substrate were desired for a particular application, the pattern of holes would not necessarily have to be substantially concentric, and even the diameter of all of the holes in a particular pattern would not have to be the same. Although probably not necessary, it is conceivable that an impedance plate could incorporate both patterns of different diameter holes and a variable plate thickness to produce some interesting flow distributions.

FIG. 7 illustrates a honeycomb extrusion die 80 having an impedance or preferential coating plate 78, such as plates 60 or 70 positioned on an upstream face of the die. The extrusion die 80 has a slot face 82 and a hole face 84. A ring-like spacer member 86 positions the plate 78 in spaced-apart relationship from the slot face 82 of the die 80. The spacer ring 86 of FIG. 7 has a thickness of ¼", but may be of any desired uniform thickness depending on the desired coating distribution. The preferential coating plate 78 is provided with an array of through-holes (not shown) with a range of hole diameters decreasing toward the plate periphery as illustrated in FIGS. 4 and 5 of the drawings. In this embodiment the plate has a uniform thickness of ⅛", but again the uniform thickness may vary depending on the number of plates utilized and the spacing from the extrusion die. As shown by the arrow F, the flow of CVD coating gas is through the preferential coating plate 78 and into the slot face 82 of the die 80.

Figure 8:
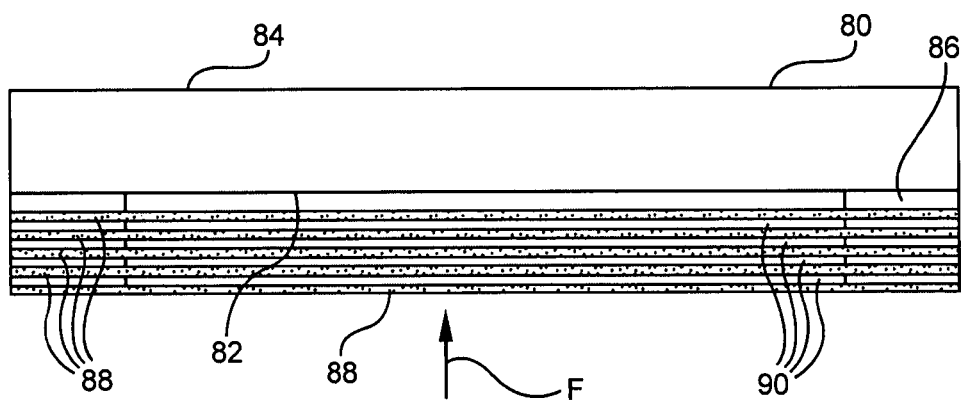
FIG. 8 illustrates an other preferred embodiment of the invention.

Finally, FIG. 8 illustrates honeycomb extrusion die 80 having a plurality of impedance or preferential coating plates 88 mounted on the upstream slot face 82, but spaced-apart from the die by a spacer ring such as 86, and from each other by a plurality of spacer ring members 90. The multiple impedance or coating plates 88 are typically thinner than the single plate 78, and may be on the order of about 0.015" thick. Each impedance plate will incorporate an array of through-holes (not shown) of decreasing diameter toward the plate periphery, as illustrated in FIGS. 4 and 5 of the drawings. Also, when utilizing multiple impedance plates 88, the spacer rings 90 are also relatively thin, such as on the order of about 0.005". The use of multiple impedance or preferential coating plates 88, has the advantage of controlling the degree of coating and the desired coating distribution by changing the number of and/or the hole distribution in the preferential coating plates. Again, as shown by the arrow F in FIG. 8, the flow of the coating gas is through the multiple plates 88 and into the slot face 82 of die 80 to produce a desired coating distribution on the slot walls of the die.

Although the now preferred die coating embodiments of the invention have been disclosed, it will be apparent to those skilled in the art that various changes and modifications may be made thereto without departing from the spirit and scope thereof as defined in the appending claims.

We claim:

1. A method of controlling the thickness distribution of a coating applied to an extrusion die for forming honeycomb ceramic structures, the extrusion die having slots in a slot face and feed holes in a hole face, the method comprising:

positioning a disk member, having an open central portion and an outer ring portion, on a face of said extrusion die, with the outer ring portion covering that portion of said extrusion die where it is desired to limit the thickness of a coating in the slots, positioning a shim member, having an open inner portion and outer ring portion, between said extrusion die and said disk member to position said disk member in a spaced-apart relationship from the extrusion die, and flowing coating material into a face of the extrusion die to produce a desired coating distribution in the slots of said extrusion die.

2. The method of claim 1, including the steps of, positioning said disk member on said slot face of said extrusion die adjacent the slots with said shim member there between to maintain said disk member in spaced-apart relationship with the extrusion die, and flowing the coating material through the open portions of said disk member and the shim, and into said slot face of the extrusion die.

3. The method of claim 2, including the steps of, positioning a second disk member adjacent said hole face of the extrusion die, and flowing a chemical vapor deposition gas into one slot face which is opposed to said hole face.

4. A method of controlling the thickness distribution of a coating applied to the slot walls of an extrusion die for forming honeycomb ceramic structures, the extrusion die having slots in a slot face and feed holes in a hole face, the slot being formed by slot walls, the method comprising:

positioning at least one perforated impedance plate, having a plurality of hole portions formed therethrough, adjacent to at least one face of said extrusion die, flowing coating material through said perforated impedance plate and into the at least one face of the extrusion die, and controlling the thickness distribution of the coating applied to the slot walls through the impedance provided by the perforated impedance plate.

5. The method of claim 4 including the step of, positioning a spacer ring between the extrusion die and at least one impedance plate to position the impedance plate in spaced-apart relationship with the extrusion die.

6. The method of claim 4 including the step of, flowing the coating material through the perforated impedance plate and into the slot face of the extrusion die.

7. The method of claim 4 including the step of, forming said hole portions in a plurality of patterns which are substantially concentric with each other.

8. The method of claim 7 including the step of, forming each concentric pattern of holes with the hole diameters different from the hole diameters in an adjacent concentric pattern of holes.

9. The method of claim 8 including the step of, gradually increasing the diameter of holes in each concentric pattern of holes as the patterns progress inwardly from the peripheral area of the extrusion die.

10. The method of claim 7 including the step of, within each individual pattern of holes, forming all holes with the same diameter for that particular pattern.

11. The method of claim 7 including the step of, forming an outermost substantially concentric pattern of holes with an outer periphery corresponding to the periphery of the feed holes in said opposite second face of the extrusion die.

12. The method of claim 7 including the step of, forming said substantially concentric pattern of holes concentrically about the center of the extrusion die.

13. The method of claim 4 including the step of, forming the perforated impedance plate with varying thicknesses.

14. The method of claim 4 including the step of, varying the thickness of the perforated impedance plate between a central portion thereof and a peripheral portion thereof.

15. The method of claim 4 including the steps of, positioning a plurality of perforated impedance plates adjacent said at least one face of the extrusion die and separating each adjacent perforated impedance plate with a spacer ring.

\* \* \* \* \*

UNITED STATES PATENT AND TRADEMARK OFFICE
CERTIFICATE OF CORRECTION

PATENT NO. : 7,303,782 B2  Page 1 of 1
APPLICATION NO. : 11/000690
DATED : December 4, 2007
INVENTOR(S) : James F. Avery et al.

It is certified that error appears in the above-identified patent and that said Letters Patent is hereby corrected as shown below:

| No. | Col. | Line | Description |
|---|---|---|---|
| 1 | 5 | 41 | "into one slot face" should be --into said slot face--. |

Signed and Sealed this

Third Day of June, 2008

JON W. DUDAS
*Director of the United States Patent and Trademark Office*